(12) United States Patent
Norling et al.

(10) Patent No.: US 10,454,266 B2
(45) Date of Patent: Oct. 22, 2019

(54) SYSTEM AND METHOD FOR CIRCUIT PROTECTION

(71) Applicant: Infineon Technologies Austria AG, Villach (AT)

(72) Inventors: Karl Norling, Villach (AT); Erwin Huber, Munich (DE)

(73) Assignee: Infineon Technologies Austria AG, Villach (AU)

( * ) Notice: Subject to any disclaimer, the term of this patent is extended or adjusted under 35 U.S.C. 154(b) by 463 days.

(21) Appl. No.: 15/332,755

(22) Filed: Oct. 24, 2016

(65) Prior Publication Data

US 2018/0115148 A1    Apr. 26, 2018

(51) Int. Cl.

| | | |
|---|---|---|
| H02H 3/00 | (2006.01) |
| H02H 3/20 | (2006.01) |
| H02H 1/00 | (2006.01) |
| H03K 5/08 | (2006.01) |
| H03K 5/24 | (2006.01) |
| H03K 17/567 | (2006.01) |
| H03K 17/687 | (2006.01) |
| H03K 17/082 | (2006.01) |

(52) U.S. Cl.
CPC ............ *H02H 3/20* (2013.01); *H02H 1/0007* (2013.01); *H03K 5/08* (2013.01); *H03K 5/24* (2013.01); *H03K 17/0822* (2013.01); *H03K 17/567* (2013.01); *H03K 17/687* (2013.01); *H03K 2217/0081* (2013.01)

(58) Field of Classification Search
None
See application file for complete search history.

(56) References Cited

U.S. PATENT DOCUMENTS

2012/0189139 A1\* 7/2012 Ohara ............... H03F 3/217
381/107

\* cited by examiner

*Primary Examiner* — Stephen W Jackson
(74) *Attorney, Agent, or Firm* — Slater Matsil, LLP

(57) ABSTRACT

A method for operating a gate driver circuit includes supplying power to the gate driver circuit from a power supply including a positive power supply voltage and a negative power supply voltage. The method also includes comparing the negative power supply voltage with a first voltage at an output terminal of a transistor, wherein the gate driver circuit is coupled to a gate terminal of the transistor. The method also includes operating the gate driver circuit when the negative power supply voltage is more negative than a trigger voltage, wherein the trigger voltage is a predetermined voltage above the first voltage. The method also includes deactivating at least a portion of the gate driver circuit when the negative power supply voltage is more positive than the trigger voltage.

30 Claims, 4 Drawing Sheets

SYSTEM AND METHOD FOR CIRCUIT PROTECTION

TECHNICAL FIELD

The present invention relates generally to a system and method for a voltage protection circuit, and, in particular embodiments, to a system and method for circuit protection.

BACKGROUND

Gate driver circuits are pervasive in many electronic applications from computers to automobiles to solar power generation. A gate driver circuit may be used to implement a portion of a switched-mode circuit, including, for example, a switched-mode power supply or another switched-mode circuit. Switched-mode circuits may be implemented using a gate driver circuit to drive the gates of one or more switch transistors, such as IGBT or MOSFET power devices.

In some cases, a negative voltage supply for a gate driver circuit may become floating or undefined due to a physical defect such as bond wire lift, bond wire breakage, solder joint lift, or due to another factor such as a failure of the external power supply or other circuit. In an event such as this, a parasitic diode between the negative voltage supply and another voltage reference may be forward-biased and produce a high current path. For example, the negative voltage supply may be a VEE supply, and the voltage reference may be a GND connected to the emitter or source of the driven switch transistor. In some cases, a gate driver circuit may have an Under-Voltage Lockout (UVLO) circuit that compares the VEE voltage with the GND voltage and deactivates the circuit when VEE is within some defined voltage of GND. However, in some cases it may be desired that some or all of the circuit continue to operate even when VEE is close to or equals GND, in which case an UVLO circuit is unsuitable. Moreover, in some embodiments using a gate driver circuit, VEE is connected to GND, and thus it is not possible to use an UVLO circuit that compares VEE and GND. For example, VEE and GND may be connected in some gate driver circuits that use an active Miller clamp to prevent re-turn-on of the switch transistor. Some gate driver circuits may include protection circuitry that senses the onset of a high current condition and takes preventative action to avoid or reduce the high current.

SUMMARY

In accordance with an embodiment of the present invention, a method for operating a gate driver circuit includes supplying power to the gate driver circuit from a power supply including a positive power supply voltage and a negative power supply voltage. The method also includes comparing the negative power supply voltage with a first voltage at an output terminal of a transistor, wherein the gate driver circuit is coupled to a gate terminal of the transistor. The method also includes operating the gate driver circuit when the negative power supply voltage is more negative than a trigger voltage, wherein the trigger voltage is a predetermined voltage above the first voltage. The method also includes deactivating at least a portion of the gate driver circuit when the negative power supply voltage is more positive than the trigger voltage.

In accordance with another embodiment of the present invention, a gate driver circuit includes a first voltage reference terminal configured to be coupled to an output terminal of a transistor. The gate driver circuit also includes a voltage detection circuit coupled to a power supply terminal and the first voltage reference terminal, wherein the voltage detection circuit is configured to detect a first supply voltage condition, a second supply voltage condition, and a third supply voltage condition. In the first supply voltage condition, the voltage at the power supply terminal is negative relative to the voltage at the first voltage reference terminal, in the second supply voltage condition, the voltage at the power supply terminal is positive relative to the voltage at the first voltage reference terminal and the voltage at the power supply terminal is less than a positive trigger voltage, and in the third supply voltage condition, the voltage at the power supply terminal is positive relative to the voltage at the first voltage reference terminal and the voltage at the power supply terminal is greater than the positive trigger voltage. The gate driver circuit also includes a shutdown circuit coupled to the voltage detection circuit, the shutdown circuit configured to deactivate at least a portion of the gate driver circuit when the voltage detection circuit detects the third supply voltage condition.

In accordance with another embodiment of the present invention, a circuit includes a voltage monitoring circuit. The voltage monitoring circuit includes a comparator, a first voltage divider coupled between a reference voltage node and a first power supply terminal, wherein an output of the first voltage divider is coupled to a first input of the comparator, and a second voltage divider coupled between a reference voltage node and an output terminal of a transistor, wherein an output of the second voltage divider is coupled to a second input of the comparator. The voltage monitoring circuit also includes a gate driver circuit coupled to the voltage monitoring circuit, wherein a portion of the gate driver is configured to be active when the output of the comparator is in a first state, wherein the portion of the gate driver circuit is configured to be inactive when the output of the comparator is in a second state, wherein the output of the comparator is in the first state when the first power supply terminal has a voltage more negative than a positive trigger voltage, and wherein the output of the comparator is in the second state when the first power supply terminal has a voltage greater than or equal to the positive trigger voltage.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
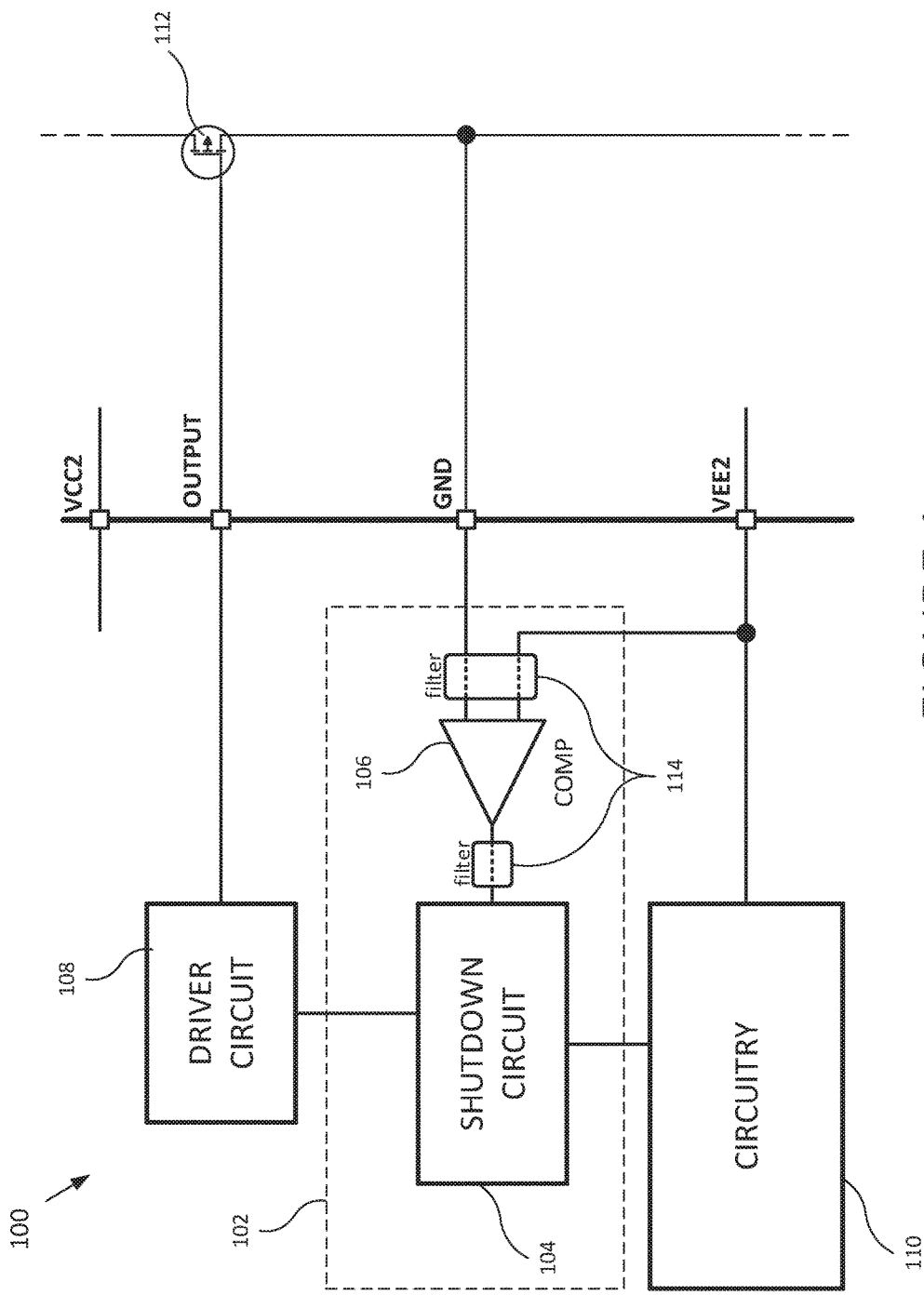
FIG. 1 is a schematic of a gate driver circuit having a protection circuit.

Before embodiments of the present invention will be explained in greater detail in the following taking reference to the figures, it is to be pointed out that the same or functionally equal elements are provided with the same reference numerals in the figures, and that a repeated description of these elements shall be omitted. Hence, the description of the elements provided with the same reference numerals is mutually interchangeable and/or applicable in the various embodiments.

In an embodiment, a protection circuit may shut down part of an integrated circuit if the voltage of a negative power supply (e.g., VEE2) is raised a certain trigger voltage above another voltage reference (e.g., GND). The protection circuit may allow the integrated circuit to operate even if, for example, the VEE2 voltage is the same as the GND voltage or the VEE2 voltage is higher than the GND voltage but less than the trigger voltage higher than the GND voltage. The protection circuit may be connected to or part of an integrated circuit such as a gate driver circuit or other type of circuit.

In some cases, an integrated gate driver can include a bipolar power supply for the gate driver portion of the circuit. For example, the integrated gate driver may include a positive power supply, a negative power supply, and a voltage reference. In some cases, and as an illustrative example, the positive power supply may be VCC2 at +15V, the negative power supply may be at VEE2 at −5 to −15V, and the voltage reference may be GND at 0V. In other cases, the integrated gate driver may be a unipolar device including a positive power supply (e.g., VCC2 at +15V) and a voltage reference (e.g., GND and/or VEE2 at 0V). In some integrated chips having p-doped substrates, the most negative power supply (e.g., VEE2) is used to bias the substrate of the chip.

In some cases, the biasing of the VEE2 potential may be lost, such as by bond wire lift or breakage, a solder joint lift, or the external power supply failing. In situations such as this, VEE2 might be left floating or undefined. In cases where a p-doped substrate is nominally biased by VEE2, the substrate may become charged due to the floating VEE2 potential. If VEE2 is undefined, there is a risk that circuits placed between VCC2 and VEE2 may become inadvertently powered through a parasitic diode or ESD diode from VEE2 to GND that becomes forward biased. For example, a parasitic diode may be turned on between a p-doped substrate nominally biased by VEE2 and an n-well nominally biased by GND. Current flowing from VEE2 to GND in this manner can increase the risk of a latch-up, overheating due to excess current, or other undesirable conditions leading to an operational failure of the application.

Some gate drivers monitor the differential voltage between GND and VEE2 and stop operation of the gate driver if this differential voltage is zero or lower than a defined differential voltage, in some cases equal to several volts. In this manner, a parasitic diode between VEE2 and GND may be turned off or prevented from turning on, or the current flowing through a turned-on parasitic diode may be limited so as to reduce possible damage to the device. However, in some situations or circuit configurations, it may be desired that the device continue to operate even if the GND-VEE2 differential voltage is zero. For example, the device may be designed to operate using a bipolar power supply or a unipolar power supply. As another example, the continued operation of the device may be a higher priority than reducing excess current or reducing the chance of damaging the device.

The present disclosure describes protection circuit methods and systems that allow an integrated circuit to operate even if, for example, the VEE2 voltage is higher than the GND voltage. The protection circuit may turn off all or part of the integrated circuit if the VEE2 voltage is a certain trigger voltage higher than the GND voltage. To protect against any parasitic diodes between VEE2 and GND, the trigger voltage may be placed somewhere between GND and the forward voltage of a diode. For example, the protection circuit may activate if VEE2 is 0.3V above GND, 0.5V above GND, or another voltage above GND. In this manner, the protection circuit may allow operation of some or all of the integrated circuit even when VEE2=GND, or when VEE2 is more positive than GND. This can allow greater flexibility and operating range of a gate driver circuit, and also allow circuit protection for unipolar configurations of gate driver circuits in which VEE2 is connected to GND. The protection circuit may thus be used in a gate driver circuit that cannot make use of an UVLO circuit. In some cases, the protection circuit may be integrated into the integrated circuit and turn off a gate driver circuit and part of the internal auxiliary circuitry of the integrated circuit in the case when the VEE2 has a voltage above the trigger voltage. In some embodiments, the protection circuit may prevent start-up of the integrated circuit in the case that the VEE2 potential is higher than the GND potential at start-up.

In some embodiments, the protection circuit may be configured to turn off part or all of the integrated circuit in the case that the VCC2 voltage is lower than the GND voltage. For example, the protection circuit may activate if VCC2 is less than a trigger voltage below the GND voltage in order to prevent any parasitic diodes from GND to VCC2 from turning on. Embodiments of the protection circuits described herein may be configured between a positive power supply voltage (e.g., VCC2) and a reference voltage (e.g., GND), and are within the scope of this disclosure.

FIG. 1 illustrates a schematic drawing of an embodiment of a protection circuit 102. The protection circuit 102 may, for example, be part of an integrated circuit, gate driver circuit, switched-mode circuit, or another circuit. The example protection circuit 102 is shown in FIG. 1 as part of a gate driver circuit 100, though in other embodiments the protection circuit 100 may be part of another type of integrated circuit or other circuit. The gate driver circuit 100 uses a bipolar power supply including VCC2, GND, and VEE2, in which VCC2 has a nominal higher voltage than GND and VEE2 has a nominal lower voltage than GND. In other embodiments, the protection circuit 102 may be part of a circuit using a unipolar power supply or be part of another type of circuit. The example protection circuit 102 is also shown in FIG. 1 as configured to compare the GND-VEE2 differential voltage, but in other embodiments the protection circuit 102 may be configured to compare the VCC2-GND differential voltage or another differential voltage.

The protection circuit 102 includes a shutdown circuit 104 connected to a comparator circuit 106. The comparator circuit 106 is connected to the reference voltage GND pin and the reference voltage VEE2 pin of the gate driver circuit. The shutdown circuit 104 is also connected to a driver circuit 108 of the gate driver circuit 100. The shutdown circuit 104 and the driver circuit 108 may also be connected to other circuitry no within the gate driver circuit 100. The driver circuit 106 is connected to and is configured to drive an external power device 112 through the OUTPUT pin of the gate driver circuit 100. The external power device 112 is also connected to GND. For example, an external power device 112 that is an IGBT may have its emitter terminal connected to GND and its gate terminal connected to OUTPUT. In other embodiments, the external power device 112 is another type of transistor, and GND may be connected to the emitter terminal or source terminal of the external power device 112. In some cases, the gate driver circuit 100 may also include circuitry that detects the voltage across the external power device 112 (e.g., a DESAT detection circuit) using GND as a reference voltage. The comparator circuit 106 monitors the differential voltage between GND and VEE2. In the event that the voltage of VEE2 raises higher than a trigger voltage above GND, the comparator circuit 106 sends a signal to the shutdown circuit 104, which operates to turn off some or all of the gate driver circuit loft. In some embodiments, an optional filter 114 may be coupled to the output of comparator circuit 106 and/or to one or both of the inputs of comparator circuit 106. The optional filter 114 may operate to reduce voltage noise or voltage fluctuations at the inputs or output of the comparator circuit 106 and thus reduce the possibility of unwanted triggering of the shutdown circuit 104.

Figure 2:
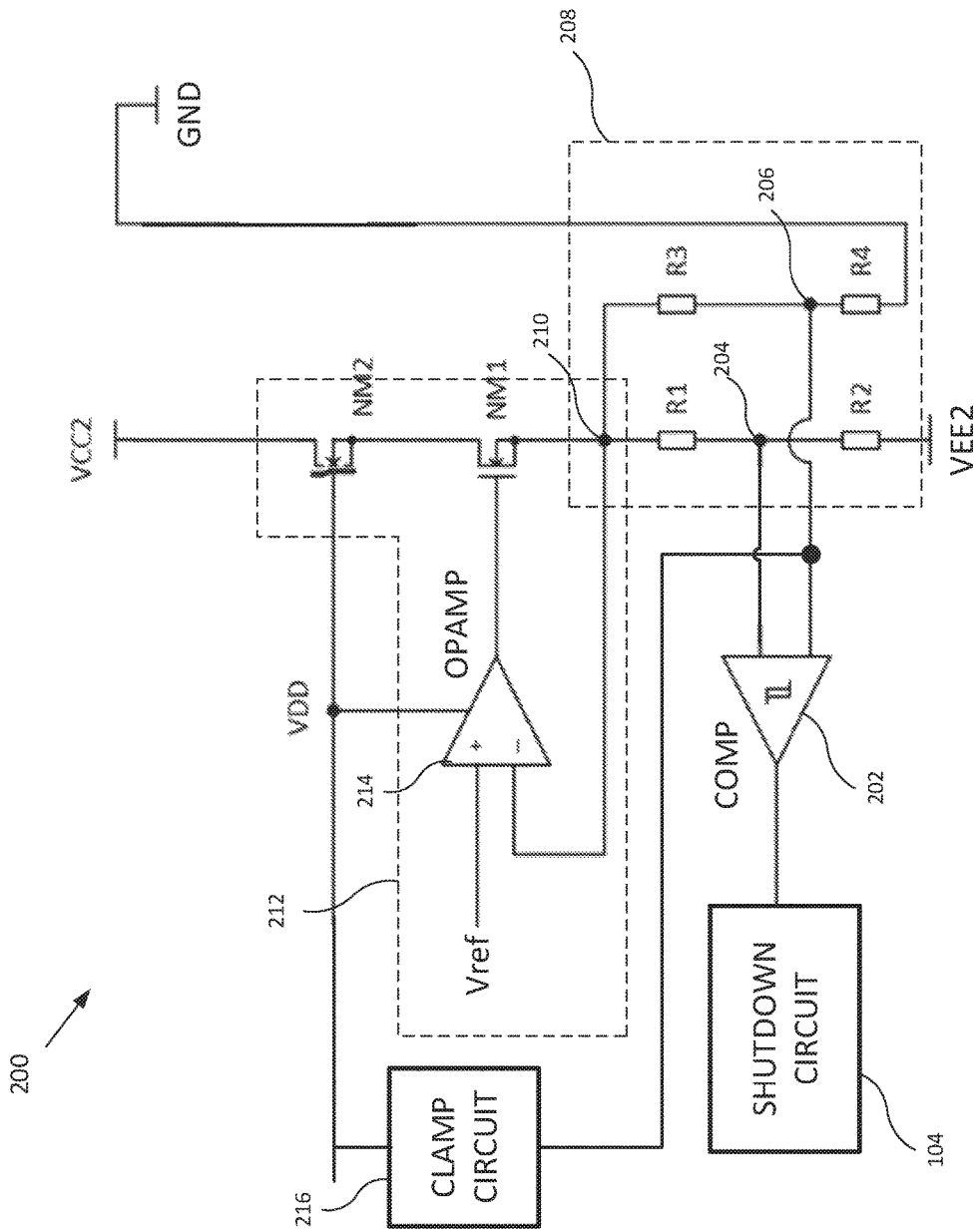
FIG. 2 is an embodiment of a protection circuit having a voltage clamp.

FIG. 2 illustrates a schematic of an embodiment of a protection circuit 200. The protection circuit 200 is configured for a bipolar power source, including VCC2, GND, and VEE2, and in this embodiment, the differential voltage between GND and VEE2 is monitored.

The example protection circuit 200 shown in FIG. 2 includes a comparator circuit 202, the output of which is connected to a shutdown circuit 104. The inputs 204, 206 of comparator circuit 202 are connected to divider network 208, which is connected to both VEE2 and GND. The example divider network 208 shown in FIG. 2 includes four resistive elements R1, R2, R3, and R4. A first branch of the divider network 208 includes R1 and R2 in series, with one end of the first branch at R1 connected to an internal reference node 210 (discussed in more detail below), and the opposite end of the first branch at R2 connected to VEE2. The first comparator input 204 is connected between R1 and R2 in the first branch. A second branch of the divider network 208 includes R3 and R4 in series, with one end of the second branch at R3 connected to the internal reference node 210 and the opposite end of the second branch at R4 connected to GND. The second comparator input 206 is connected between R3 and R4 in the second branch. The resistive elements R1, R2, R3, or R4 may each be one or more resistors, circuits, transistors, or other types of elements. In some embodiments the divider network 208 and/or the resistive elements R1, R2, R3, or R4 have a different configuration, connections, or arrangement. In some configurations, a filter is implemented before and/or after the comparator circuit 202 to reduce noise from the power supply lines VEE2 and GND. In other embodiments, other configurations, other comparator circuits, or other detection circuits may be used. For example, circuits utilizing an ADC, switched capacitors, or other circuits or techniques may be used.

The internal reference node 210 has a regulated voltage of Vref that is supplied by the internal reference circuit 212. The example internal reference circuit 212 is a voltage regulator including a reference voltage source Vref, an op-amp 214, a transistor NM1, and an optional transistor NM2. The internal reference circuit 212 provides a regulated voltage of Vref to the internal reference node 210 and is configured to withstand DC current loads. The optional transistor NM2 is connected to voltage reference VDD and to NM1 and may be configured to handle high voltages. For example, NM1 may have a relatively thick gate dielectric. In this manner, NM2 may help protect NM1 or the comparator circuit 202 or the op-amp 214 from high voltages. In some configurations NM2 may be connected to a different voltage reference, and in some configurations NM2 may be omitted with the drain terminal of NM1 connected to VDD directly. Internal reference circuit 212 is an example circuit to provide a regulated voltage; other circuits and configurations are possible. In some embodiments, the internal reference circuit 212 is optional. For example, the internal reference circuit 212 may not be present in embodiments in which the regulated voltage Vref is supplied to internal reference node 210 by a separate circuit, in embodiments in which internal reference node 210 is coupled directly or through a resistor to VCC2, or in other embodiments.

The protection circuit 200 also includes an optional clamp circuit 216 that is connected to the second input 206 of the comparator circuit 202. FIG. 2 shows the clamp circuit 216 connected to VDD, though in other embodiments the clamp circuit 216 may be connect to VEE2 or another voltage supply. The clamp circuit 216 operates to limit the voltage of the second input 206 to protect the comparator circuit 202 from high voltages. The protection circuit 200 may be configured to limit the voltage at the second input 206 to below a specific voltage above the VEE2 voltage. In some cases the comparator circuit 202 may be configured to be less sensitive to high voltages at its inputs and the clamp circuit 216 may not be needed. In other configurations, the clamp circuit 216 may limit the first input 204 to a specific voltage.

The comparator circuit 202 compares the voltages between its first input 204 and its second input 206, and activates the shutdown circuit 104 if the voltage at the first input 204 is higher than the voltage at the second input 206 by a predetermined trigger voltage. The trigger voltage may be determined from the voltage of Vref and the resistances of R1, R2, R3, and R4. For example, comparator circuit 202 may be triggered if GND has a voltage equal to GND_trig. Equation 1 gives an expression for GND_trig with VEE2 taken to be 0V:

$$\text{GND\_trig} = \left(1 - \frac{R_2(R_3 + R_4)}{R_4(R_1 + R_2)}\right) Vref \quad (1)$$

Depending on the reference voltage Vref and the resistive values of R1, R2, R3, and R4, the trigger voltage (i.e., GND_trig) may be configured for a specific voltage for GND relative to VEE2. In particular, the trigger voltage may be configured to either a positive or negative voltage for GND relative to VEE2. In particular, the trigger voltage may be configured to a voltage such that the differential voltage (GND−VEE2) is less than the forward turn-on voltage of a diode. For example, the trigger voltage may be configured to GND−VEE2=0.3V, for an example case in which VEE2 is greater than GND. In other cases, the trigger voltage may be configured to a voltage such as GND−VEE2=+0.3V, 0V, −0.2V, −0.4V or another voltage.

Figure 3:
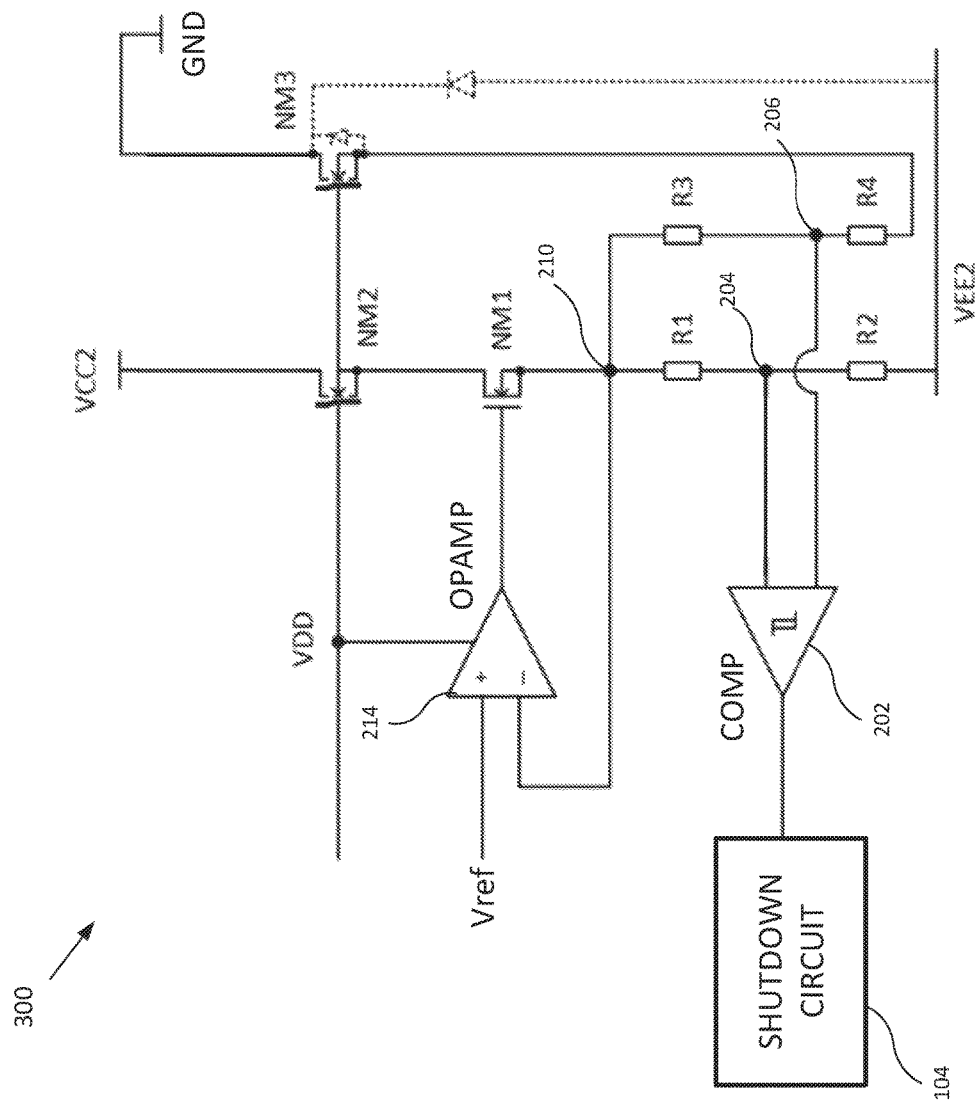
FIG. 3 is a is an embodiment of a protection circuit having a voltage-limiting transistor.

FIG. 3 illustrates a schematic of an embodiment of a protection circuit 300. The example protection circuit 300 is similar to the protection circuit 200 shown in FIG. 2, and includes a comparator circuit 202, a shutdown circuit 104, a divider network 208, and an internal reference circuit 212. Protection circuit 300 does not include a clamp circuit like clamp circuit 216 shown in FIG. 2. In protection circuit 300, the resistive element R4 is connected to GND through a transistor NM3, and the gate terminal of NM3 is connected to VDD. Transistor NM3 helps protect the second input 206 of the comparator circuit 202 from excess current and voltage. For example, during normal operation in which GND is greater than VEE2, NM3 is saturated and acts as a cascode transistor, limiting the current flowing through the divider network 208. In this manner, the use of a transistor like NM3 shown in FIG. 3 may have less current or less power consumption than the use of a clamp circuit such as clamp circuit 216 shown in FIG. 2. Similar to protection circuit 200, the trigger voltage may be determined by the values of the reference voltage Vref and resistive elements R1, R2, R3, and R4. In some cases when NM3 is in a linear region (e.g., in some cases when VEE2 is relatively close to GND), NM3 acts like a resistor, and this effective resistance of NM3 may also determine the trigger voltage in addition to the reference voltage Vref and resistive elements R1, R2, R3, and R4.

Figure 4:
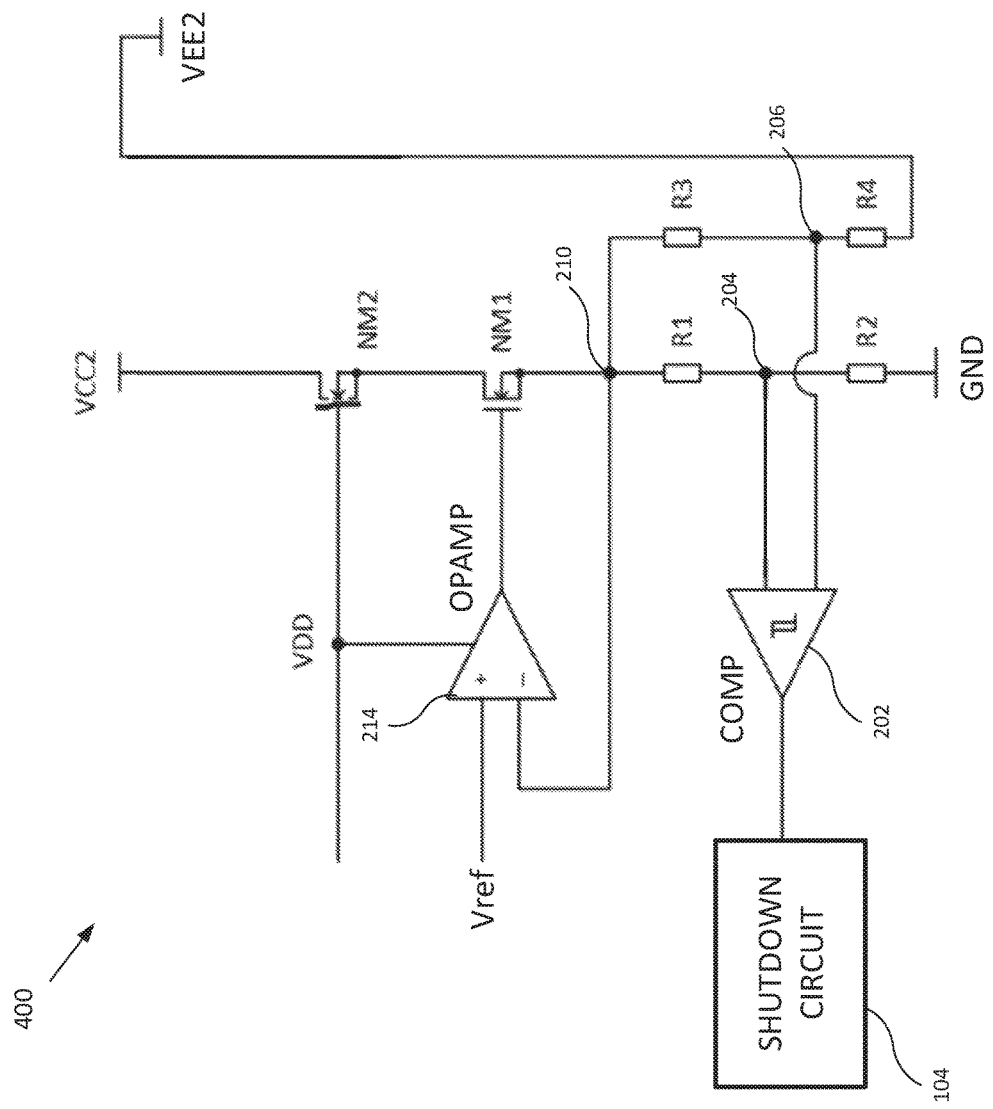
FIG. 4 is an embodiment of a protection circuit having comparator circuit inputs referred to GND.

FIG. 4 illustrates a schematic of an embodiment of a protection circuit 400. The example protection circuit 400 is similar to the protection circuit 200 shown in FIG. 2 and includes a comparator circuit 202, a shutdown circuit 104, a divider network 208, and an internal reference circuit 212. In the protection circuit 400, the comparator circuit 202 refers the voltage at the inputs 204, 206 to GND. (Compare protection circuit 400 with protection circuits 200 and 300 in which the voltage at the inputs 204, 206 were referred to VEE2.) The protection circuit 400 does not include a clamp circuit or a transistor NM3, but a clamp circuit or other types of voltage limitation may be present in other embodiments. In protection circuit 400, the resistive element R4 is connected to VEE2 and the resistive element R2 is connected to GND. This type of protection circuit configuration may also be used with a unipolar power supply. Similar to protection circuit 200, the trigger voltage may be determined by the values of the reference voltage Vref and resistive elements R1, R2, R3, and R4.

Advantages of some embodiments of the protection circuit include the configurability of the protection circuit to operate with both bipolar and unipolar power supplies. The differential trigger voltage between GND and VEE2 (or between VCC2 and GND) may be tuned depending on what is desired for an application. The polarity of the differential trigger voltage may also be tuned, for example the trigger voltage may be set for the differential voltage (GND−VEE2) being a positive voltage or a negative voltage or even zero. In this manner, the protection circuit may allow portions of the integrated circuit to operate under a larger range of differential voltages of the power supply.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for operating a gate driver circuit comprising:
supplying power to the gate driver circuit from a power supply comprising a positive power supply voltage and a negative power supply voltage;
comparing the negative power supply voltage with a first voltage at an output terminal of a transistor, wherein the gate driver circuit is coupled to a gate terminal of the transistor;
operating the gate driver circuit when the negative power supply voltage is more negative than a trigger voltage, wherein the trigger voltage is a predetermined voltage above the first voltage based on the comparing; and
deactivating at least a portion of the gate driver circuit when the negative power supply voltage is more positive than the trigger voltage based on the comparing.

2. The method of claim 1, wherein the trigger voltage is between about 0.1V and about 0.5V above the first voltage.

3. The method of claim 1, wherein the trigger voltage above the first voltage by less than a forward operating voltage of a diode.

4. The method of claim 1, wherein the output terminal of the transistor is an emitter terminal or a source terminal.

5. The method of claim 1, wherein the transistor is a MOSFET.

6. The method of claim 1, wherein comparing comprises:
dividing the negative power supply voltage with respect to a reference voltage to form a first divided voltage;
dividing the first voltage with respect to the reference voltage to form a second divided voltage; and
comparing the first divided voltage with the second divided voltage.

7. The method of claim 6, wherein:
dividing the negative power supply voltage with respect to the reference voltage comprises using a first voltage divider circuit comprising a first plurality of resistive elements; and
dividing the first voltage with respect to the reference voltage comprises using a second voltage divider circuit comprising a second plurality of resistive elements.

8. The method of claim 1, wherein comparing comprises using a comparator circuit.

9. The method of claim 8, further comprising limiting a voltage at an input terminal of the comparator circuit.

10. The method of claim 9, wherein limiting the voltage at the input terminal of the comparator circuit comprises using a clamp circuit coupled to the input terminal of the comparator circuit.

11. A gate driver circuit, comprising:
a first voltage reference terminal configured to be coupled to an output terminal of a transistor;
a voltage detection circuit coupled to a power supply terminal and the first voltage reference terminal, wherein the voltage detection circuit is configured to detect a first supply voltage condition, a second supply voltage condition, and a third supply voltage condition wherein:
in the first supply voltage condition, a voltage at the power supply terminal is negative relative to the voltage at the first voltage reference terminal;
in the second supply voltage condition, the voltage at the power supply terminal is positive relative to the voltage at the first voltage reference terminal and the voltage at the power supply terminal is less than a positive trigger voltage; and
in the third supply voltage condition, the voltage at the power supply terminal is positive relative to the voltage at the first voltage reference terminal and the voltage at the power supply terminal is greater than the positive trigger voltage; and
a shutdown circuit coupled to the voltage detection circuit, the shutdown circuit configured to deactivate at least a portion of the gate driver circuit when the voltage detection circuit detects the third supply voltage condition.

12. The circuit of claim 11, wherein the voltage detection circuit comprises a comparator having inputs coupled to the power supply terminal and the first voltage reference terminal.

13. The circuit of claim 12, wherein the voltage detection circuit further comprises:
a first voltage divider coupled between a second voltage reference terminal and the power supply terminal, wherein an output of the first voltage divider is coupled to a first input of the comparator; and a second voltage divider coupled between the second voltage reference terminal and the first voltage reference terminal, wherein an output of the second voltage divider is coupled to a second input of the comparator.

14. The circuit of claim 13, wherein:
the first voltage divider comprises a first resistive element coupled between the first input of the comparator and the power supply terminal, and a second resistive element coupled between the first input of the comparator and the second voltage reference terminal; and
the second voltage divider comprises a third resistive element coupled between the second input of the comparator and the first voltage reference terminal, and a fourth resistive element coupled between the second input of the comparator and the second voltage reference terminal.

15. The circuit of claim 13, further comprising a voltage regulator coupled to the second voltage reference terminal, the voltage regulator configured to regulate the voltage at the second voltage reference terminal.

16. The circuit of claim 13, further comprising a second voltage reference supply circuit coupled to the second voltage reference terminal.

17. The circuit of claim 11, wherein the positive trigger voltage is less than a forward operating voltage of a diode.

18. The circuit of claim 11, wherein the power supply terminal is a first power supply terminal, and wherein the voltage detection circuit is coupled to a second power supply terminal different from the first power supply terminal.

19. The circuit of claim 11, wherein the transistor is an IGBT.

20. The circuit of claim 11, wherein the output terminal of the transistor is an emitter terminal or a source terminal.

21. A circuit comprising:
a voltage monitoring circuit, comprising:
a comparator;
a first voltage divider coupled between a reference voltage node and a first power supply terminal, wherein an output of the first voltage divider is coupled to a first input of the comparator; and
a second voltage divider coupled between the reference voltage node and an output terminal of a transistor, wherein an output of the second voltage divider is coupled to a second input of the comparator; and a gate driver circuit coupled to the voltage monitoring circuit, wherein a portion of the gate driver circuit is configured to be active when the output of the comparator is in a first state, wherein the portion of the gate driver circuit is configured to be inactive when the output of the comparator is in a second state, wherein the output of the comparator is in the first state when the first power supply terminal has a voltage more negative than a positive trigger voltage, and wherein the output of the comparator is in the second state when the first power supply terminal has a voltage greater than or equal to the positive trigger voltage.

22. The circuit of claim 21, wherein the gate driver circuit is configured to be coupled to a gate terminal of the transistor.

23. The circuit of claim 21, wherein the transistor is an IGBT.

24. The circuit of claim 21, wherein the output terminal of the transistor is an emitter terminal or a source terminal.

25. The circuit of claim 21, wherein the positive trigger voltage is between about 0.1V and about 0.5V more positive than the voltage at the output terminal of the transistor.

26. The circuit of claim 21, wherein:
the first voltage divider comprises a first resistor coupled between the first input of the comparator and the first power supply terminal, and a second resistor coupled between the first input of the comparator and the reference voltage node; and
the second voltage divider comprises a third resistor coupled between the second input of the comparator and the output terminal of the transistor, and a fourth resistor coupled between the second input of the comparator and the reference voltage node.

27. The circuit of claim 26, further comprising a cascode transistor having a load path coupled between the third resistor and the output terminal of the transistor.

28. The circuit of claim 21, further comprising a filter circuit coupled to the first input of the comparator.

29. The circuit of claim 21, further comprising a voltage regulator coupled between a second power supply voltage terminal and the reference voltage node.

30. The circuit of claim 21, further comprising a clamp circuit coupled between a second power supply voltage terminal and the reference voltage node.

* * * * *